United States Patent [19]
Lin et al.

[11] Patent Number: 5,580,112
[45] Date of Patent: Dec. 3, 1996

[54] VACUUM PENCIL HAVING A SHORT TIP WITH AN ABUTMENT MEANS

[75] Inventors: Dean E. Lin, Hsin-chu County; Chien K. Chou, Hsin-chu; Chih M. Chen, Tao Yuan County, all of Taiwan

[73] Assignee: Taiwan Semiconductor Manufacturing Company Ltd., Hsin-chu, Taiwan

[21] Appl. No.: 440,093

[22] Filed: May 10, 1995

[51] Int. Cl.⁶ ................................................. B25J 15/06
[52] U.S. Cl. ........................................ 294/64.1; 29/743
[58] Field of Search ................... 294/64.1–64.3; 29/743; 269/21; 901/40

[56] References Cited

U.S. PATENT DOCUMENTS

| 4,002,254 | 1/1977 | Olofsen .......................... 294/64.3 X |
| 4,037,830 | 7/1977 | Poluzzi et al. ................... 269/21 |
| 4,496,180 | 1/1985 | Hillman et al. .................. 294/64.1 |
| 4,767,142 | 8/1988 | Takahashi et al. ............... 294/64.1 |
| 4,981,315 | 1/1991 | Poli et al. ....................... 294/64.1 |
| 5,195,729 | 3/1993 | Thomas et al. .................. 269/21 |
| 5,280,979 | 1/1994 | Poli et al. ....................... 294/64.1 |
| 5,374,090 | 12/1994 | Goff ................................ 294/64.1 |

FOREIGN PATENT DOCUMENTS

| 2631502 | 1/1978 | Germany ...................... 294/64.1 |
| 66578 | 3/1991 | Japan ............................ 294/64.1 |
| 6320432 | 11/1994 | Japan ............................ 294/64.1 |

*Primary Examiner*—Johnny D. Cherry
*Attorney, Agent, or Firm*—George O. Saile; William J. Stoffel

[57] ABSTRACT

The invention provides a vacuum pencil having an abutment pin which limits the distance the tip of the vacuum pencil can extend past the edge of a wafer thus reducing scratches on the device sides of adjacent wafers. The vacuum pencil has a relatively flat tip connected to a body. The tip has a flat top side for engaging a wafer. The top side of the tip has channels for delivering a vacuum to seal against the wafer against the tip. The top side of the tip also has an pin mounted between the channels and the body. A passage for delivering a vacuum runs through the body and the channel is connected to the channel in the tip. The pin can be a pentagon shaped pin which is about 1 mm high.

12 Claims, 3 Drawing Sheets

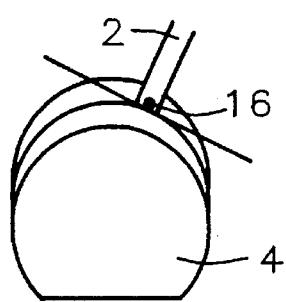 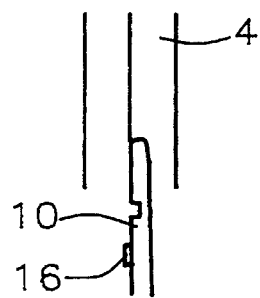
*FIG. 6A*  *FIG. 6B*
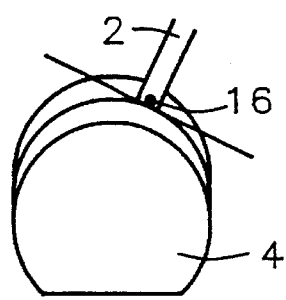 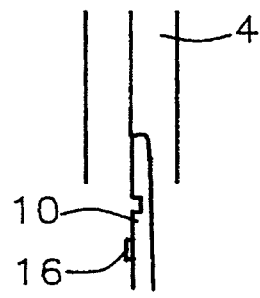
*FIG. 7A*  *FIG. 7B*
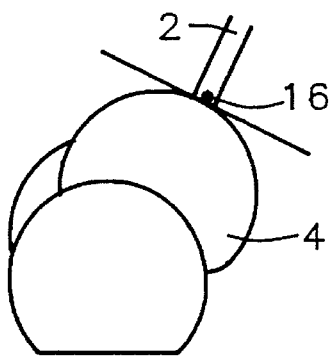
*FIG. 8*

VACUUM PENCIL HAVING A SHORT TIP WITH AN ABUTMENT MEANS

BACKGROUND OF THE INVENTION

1. Field of the Invention

The present invention relates in general to devices used to manually lift and transport semiconductor substrates and more particularly to vacuum pencils.

2. Description of the Prior Art

Semiconductor manufacturers have a need to manually lift and individually transport thin, fragile semiconductor wafers over short distances, for instance, from a storage container to processing equipment. Tweezers are often used for this purpose, although tweezers can scratch and damage the fragile wafer surfaces. Sophisticated vacuum wands are also in use; such vacuum wands, must typically be connected to a central source of vacuum and include a form of trigger or valve for selectively coupling the vacuum to the tip of the tool.

Semiconductor wafers are often stored and processed standing upright next to other wafers in a row in a wafer cassette of some type. The wafers are normally facing in one direction so that the device side of one wafer faces the backside of the adjacent wafer. Often the spacing between wafers is tight so that many wafers may fit into a small carrier box or into a processing reactor or furnace. The spacing between wafers can be between about 3 to 7 mm and typically can be about 5 mm.

Wafers are moved with a vacuum pencil by inserting the vacuum pencil between two wafers and contacting the tip of the vacuum pencil to the backside of a wafer. The vacuum holds the wafer on to the tip and the wafer is lifted out.

Current vacuum pencils create several problems when used to move wafers, especially wafers that are closely stacked together. One problem is that the device sides of wafers are often scratched when the vacuum pencil is inserted between two wafers. Wafers are positioned in wafer boats so that the device side of one wafer faces the back side of the wafer in front of it. To use a vacuum pencil to pick up a wafer, the operator inserts the vacuum pencil tip between two wafers to contact the back side of the wafer she wants to lift. However, the operator often touches the vacuum pencil tip to the device side of an adjacent wafer. This often occurs when an operator accidentally inserts the vacuum pencil tip too far down past the edge of the wafer. When the tip is overextended too far past the wafer edge, a small change in the vacuum pencil position will cause the tip to move against the device side.

Therefore, there is a need for a vacuum pencil that can reduce the number of scratches to wafers and still effectively move/hold the wafer.

SUMMARY OF THE INVENTION

It is a primary object of the present invention to provide a non-destructive means for lifting and transport of fragile, thin semiconductor wafers.

It is a further object of the present invention to provide a thin, easily manipulated means for lifting semiconductor wafers from close, upright stance in a wafer cassette.

It is a still further object of the present invention to provide an uncomplicated and inexpensive means to lift and transport semiconductor wafers, which will not contaminate the semiconductor wafers with particles or debris.

It is yet another object of the present invention to provide a means to limit the distance a vacuum pencil tip will extend past a wafer edge when the wafer is being held by the vacuum pencil tip.

Accordingly, the present invention provides a vacuum pencil having an abutment means which limits the distance the tip of the vacuum pencil can extend past the edge of a wafer thus reducing scratches on the device side of an adjacent wafer. The vacuum pencil has a relatively flat tip connected to a body. The tip has a first planar side for engaging a wafer. The first side of the tip includes a channel means for delivering a vacuum across the tip surface. A passage runs through the body and is connected to the channel means in the tip. The passage delivers a vacuum to the channel means which seals (holds) the wafer against the first side of the tip. The first side of the tip also has an abutment means mounted between the channel means and the body. The abutment means projects above the plane of the first side. The abutment means preferably can be a pentagon shaped pin which is about 1 mm thick. The abutment means limits the distance the tip of the vacuum pencil can extend past the edge of a wafer. In operation the abutment means reduces scratches on the device side of wafers by limiting the distance the vacuum tip extends past the wafer edge. Moreover, if the tip is inserted past the abutment means, the abutment means prevents a vacuum seal from forming and requires the tip to be withdrawn to the proper distance. Also, the distance between the abutment means and the end of tip of the vacuum pencil is about 40 mm. The limited length of the tip also reduces the amount of scratches.

Other objects, advantages and features of the present invention will become apparent from the following specification when taken in conjunction with the accompanying drawings.

BRIEF DESCRIPTION OF THE DRAWINGS

The features and advantages of a vacuum pencil according to the present invention will be more clearly understood from the following description taken in conjunction with the accompanying drawings in which like reference numerals designate similar or corresponding elements, regions and portions and in which:

FIGS. 4 through 8 show the operation of the vacuum pencil of the present invention picking up a wafer.

FIGS. 4A, 5A, 6A, 7A and 8, show the vacuum tip of the present invention picking up a wafer from between two vertically spaced adjacent wafers.

FIGS. 4B, 5B, 6B, and 7B show side views of the vacuum tip of the present invention picking up a wafer from between two vertically spaced adjacent wafers.

DETAILED DESCRIPTION OF THE PREFERRED EMBODIMENTS

Accordingly, the current invention provides a vacuum pencil with an abutment means which reduces the amount of scratches on wafers. The vacuum pencil described herein has dimensions listed for use with about 4 to 8 inch diameter semiconductor wafers. It is understood by those skilled in the art that the vacuum pencil of the present invention can be scaled for different wafer sizes.

Figure 1:
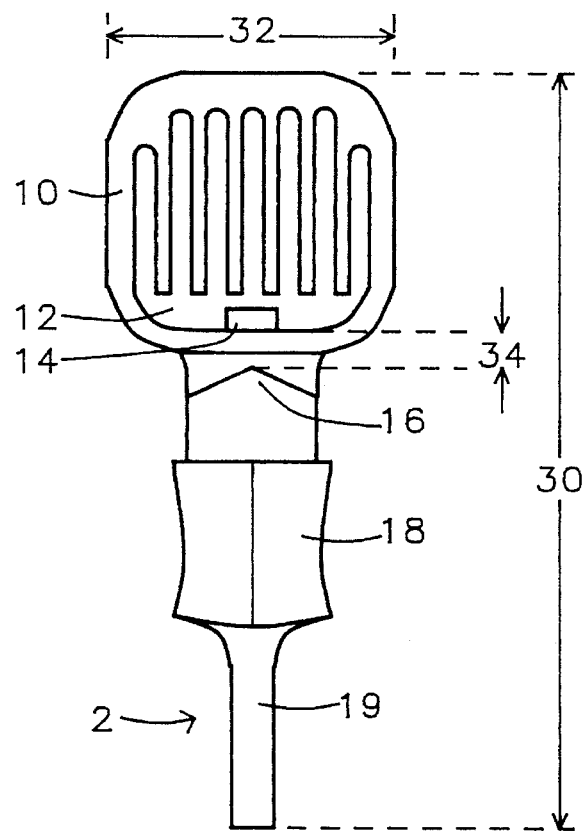
FIG. 1 shows a top plan view of the vacuum pencil of the present invention having an abutment means.

As shown in FIG. 1, the vacuum pencil 2 has a relatively flat tip 10 connected to a body 18, 19. The tip 10 has a first planar side for engaging a wafer. The length 30 of the tip 10 and the body 18/19 is between about 80 mm and 170 mm, and more preferably about 104 mm. The width 32 of the tip is between about 10 and 50 mm and more preferably about 35 mm. The thickness 40 of the tip is between about 1 and 4 mm and more preferably about 2 mm.

The first side of the tip 10 has a channel means. The channel means can be comprised of a plurality of parallel channels 12 that are interconnected. The channel means can also be comprised of a plurality of parallel channels 12 that are interconnected by an orthogonal channel as shown in FIG. 1.

Figure 2:
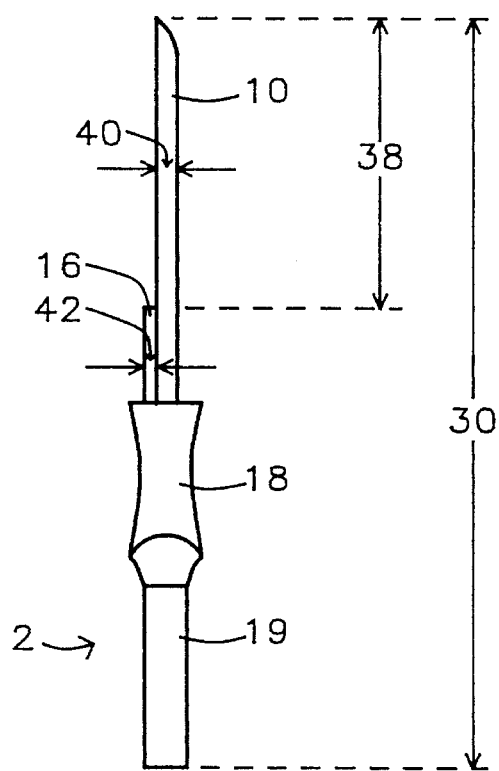
FIG. 2 shows a side view of the vacuum pencil of the present invention having an abutment means.
Figures 4A, 4B:
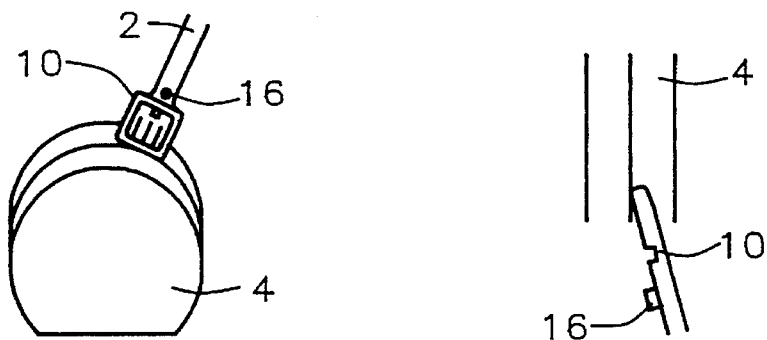
Figures 5A, 5B:
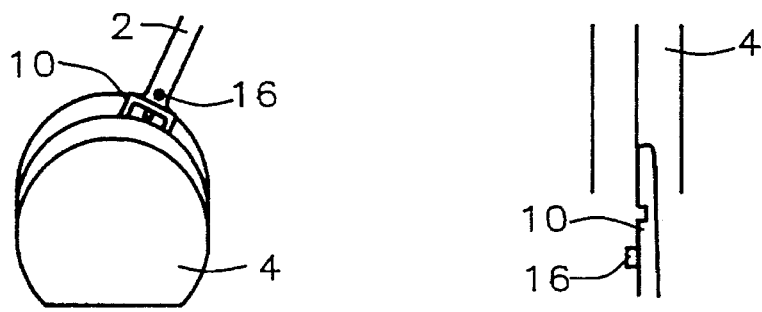

The first side of the tip has an abutment means mounted between the channel means and the body. As shown in FIG. 1, the abutment means can preferably be a pentagon shaped (e.g., 5 sided) pin 16. The abutment means can have many shapes such as a round cylinder pin (as shown in FIG. 4A), square, or a triangle. The distance 38 between the abutment means and the end of the tip 10 away from the body can be between about 30 and 90 mm and more preferably is about 40 mm. As shown in FIG. 2, the abutment means projects above the plane of the first side a distance 42 in the range of 0.5 to 1.5 mm and more preferably about 1 mm. Where the spacing between standing wafers is about 5 mm, it is important that the abutment means be less than 1.5 mm. If the abutment means is too high, it will interfere with the adjacent wafers.

The vacuum pencil 2 and abutment means can be formed of poly ether ether ketone (PEEK), a mixture of PEEK and carbon fiber, or polyimide. If the vacuum pencil is intended to handle hot wafers, it should be formed of a material to withstand the high temperatures. For example, PEEK can withstand temperatures greater than 300° C., PEEK and carbon fibers can withstand temperature less than or equal to 300° C., and Polyimide can withstand temperatures greater than 450° C.

Figure 3:
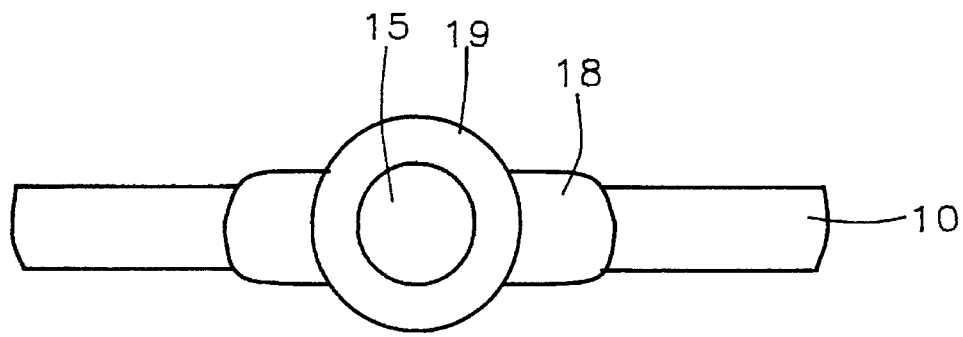
FIG. 3 shows an end view of the vacuum pencil of the present invention having an abutment means.

A passage 15 runs through the body 18 and the tip 10 as shown in FIG. 3. The passage 15 is connected to the channel 12 in the tip at position 14 as shown in FIG. 1. The distance 34 between the channel 12 or the passage 15 and the abutment means can be in the range of about 3 to 60 mm.

The operation of the vacuum pencil of the present invention is shown in FIGS. 4 through 8. As shown in FIGS. 4A, 4B, 5A and 5B, wafers 4 are standing upright in a row. Vacuum tip 10 is inserted down between the wafers. When the tip 10 is inserted the proper distance, the abutment means 16 bumps the wafer edge, thus preventing the tip from being inserted any further as shown in FIG. 6b. An important function of the abutment means is that if the vacuum tip is extended past the abutment means, the abutment prevents the vacuum from holding the wafer. This helps train the operators to use the abutment means to insert the tip the proper distance and use the abutment means to stop the insertion. Vacuum is applied and the tip 10 attaches to the wafer 4 as shown in FIGS. 7A and 7B. The wafer 4 can be lifted out without scratches as seen in FIG. 8.

The thin abutment means 16 encourages the operator to handle the wafers in such a way to minimize scratches. To successfully stop the tip insertion by the abutment means, the operator will tend to move the tip 10 as close as possible to the backside of the target wafer. The tip will then be positioned the farthest distance to the circuit side of the adjacent wafer thus preventing scratches. If the tip is not kept close to the backside of the target wafer, the tip will be inserted past the abutment means and the abutment means will prevent the tip from forming a vacuum seal with the wafer. Thus, the abutment means encourages the operator to hold the tip close to the target wafer and not to insert the tip in too far thereby reducing scratches to the adjacent wafers.

While the invention has been particularly shown and described with reference to the preferred embodiments thereof, it will be understood by those skilled in the art that various changes in form and details may be made without departing from the spirit and scope of the invention.

What is claimed is:

1. A vacuum pencil with an abutment means comprising:

a flat tip connected to a body, said tip having a back end toward said body, having a front end away from said body and having sides, said tip having a first planar side for engaging a wafer, said first planar side of said tip having a channel means, said channel means comprised of a plurality of parallel channels, said parallel channels parallel to said sides of said tip, said first planar side of said tip having an abutment means mounted between said channel means and said body, the distance between said abutment means and said front end of said tip is between about 30 and 90 mm, said abutment means projecting above the plane of said first planar side a height of between about 0.5 and 1.5 mm, and a passage running through said body and tip, said passage connected to said channel means in said tip.

2. The vacuum pencil of claim 1 wherein said abutment means is a pentagon shaped pin.

3. The vacuum pencil of claim 1 wherein said abutment means is a cylindrical shaped pin.

4. The vacuum pencil of claim 1 wherein the length of said tip and said body is between about 80 and 170 mm.

5. The vacuum pencil of claim 1 wherein said vacuum pencil is formed of a material selected from the group consisting of poly ether ether ketone, poly ether ether ketone and carbon fibers, and polyimide.

6. The vacuum pencil of claim 1 wherein the thickness of said tip is between about 1 and 4 mm.

7. The vacuum pencil of claim 1 wherein the width of said tip is between about 10 and 50 mm.

8. The vacuum pencil of claim 1 wherein said channel means in said tip is comprised of seven parallel channels that are interconnected by one orthogonal channel, said orthogonal channel perpendicular to said sides of said tip.

9. The vacuum pencil of claim 1 wherein the distance between said channel means and the abutment means is between about 3 to 60 mm.

10. A vacuum pencil with an abutment means for handling a semiconductor wafer comprising:

a flat tip connected to a body, said tip having a back end toward said body, having a front end away from said body and having sides, the distance between said pin and said front end of said tip is between about 30 and 90 mm, the length of said tip and said body is between about 80 and 170 mm, the thickness of said tip is between about 1 and 4 mm, and the width of said tip is between about 10 and 50 mm, said tip having a width smaller than the diameter of said wafer, said tip having a first planar side for engaging said wafer, said first planar side of said tip having a channel means, said channel means in said tip is comprised of more than two parallel channels that are interconnected by an orthogonal channel, said orthogonal channel perpendicular to said sides of said tip, said first side of said tip having an abutment means mounted between said channel means and said body, the distance between said abutment means and said front end of said tip is between about 30 and 90 mm, said abutment means comprised of a pentagon shaped pin, said abutment means projecting above the plane of said first side, said abutment means protrudes above the plane of the first planar side of said tip a height between about 0.5 and 1.5 mm, and the distance between said channel means and said abutment means is between about 3 to 60 mm, and a passage running through said body and tip, said passage connected to said orthogonal channel in said tip.

11. The vacuum pencil of claim 10 wherein said vacuum pencil is formed of a material selected from the group consisting of: poly ether ether ketone, poly ether ether ketone and carbon fibers, and polyimide.

12. A vacuum pencil with an abutment means for handling a semiconductor wafer comprising:

a flat tip connected to a body, said tip having a back end toward said body, having a front end away from said body and having sides, the distance between said pin and said front end of said tip is between about 30 and 90 mm, the length of said tip and said body is between about 80 and 170 mm, the thickness of said tip is between about 1 and 4 mm, and the width of said tip is between about 10 and 50 mm, said tip having a width smaller than the diameter of said wafer, said tip having a first planar side for engaging said wafer, said first planar side of said tip having a channel means, said channel means in said tip is comprised of seven parallel channels that are interconnected by an orthogonal channel, said orthogonal channel perpendicular to said sides of said tip, said first side of said tip having an abutment means mounted between said channel means and said body, the distance between said abutment means and said front end of said tip is between about 30 and 90 mm, said abutment means comprised of a pentagon shaped pin, said abutment means projecting above the plane of said first side, said abutment means protrudes above the plane of the first planar side of said tip a height between about 0.5 and 1.5 mm, and the distance between said channel means and said abutment means is between about 3 to 60 mm, and a passage running through said body and tip, said passage connected to said orthogonal channel in said tip, and said vacuum pencil formed of a material selected from the group consisting of poly ether ether ketone, poly ether ether ketone and carbon fibers, and polyimide.

* * * * *